(12) United States Patent
Zhang

(10) Patent No.: US 10,396,245 B2
(45) Date of Patent: Aug. 27, 2019

(54) LIGHT EMITTING ELEMENT HAVING A CONDUCTIVE PATTERN AND FABRICATION METHOD THEREOF

(71) Applicant: BOE TECHNOLOGY GROUP CO., LTD., Beijing (CN)

(72) Inventor: Bo Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/545,176

(22) PCT Filed: Feb. 7, 2017

(86) PCT No.: PCT/CN2017/073058
§ 371 (c)(1),
(2) Date: Jul. 20, 2017

(87) PCT Pub. No.: WO2017/185849
PCT Pub. Date: Nov. 2, 2017

(65) Prior Publication Data
US 2018/0212103 A1    Jul. 26, 2018

(30) Foreign Application Priority Data

Apr. 29, 2016  (CN) .......................... 2016 1 0282677

(51) Int. Cl.
*H01L 51/50* (2006.01)
*H01L 33/36* (2010.01)
(Continued)

(52) U.S. Cl.
CPC .......... *H01L 33/36* (2013.01); *H01L 25/0753* (2013.01); *H01L 27/15* (2013.01);
(Continued)

(58) Field of Classification Search
CPC . H01L 51/50; H01L 51/5072; H01L 51/5056; H01L 51/5048; H01L 51/5084
See application file for complete search history.

(56) References Cited

U.S. PATENT DOCUMENTS

2015/0207051 A1    7/2015   Yoon et al.

FOREIGN PATENT DOCUMENTS

| CN | 101490858 A | 7/2009 |
| CN | 103296046 A | 9/2013 |

(Continued)

OTHER PUBLICATIONS

International search report dated May 11, 2017 for corresponding international application PCT/CN2017/073058 with English translation attached.

*Primary Examiner* — Hoai V Pham
(74) *Attorney, Agent, or Firm* — Nath, Goldberg & Meyer; Joshua B. Goldberg; Daniel Bissing

(57) ABSTRACT

The present invention discloses a light emitting element and a fabrication method thereof. The light emitting element includes: an anode electrode, a hole transport layer, a light emitting layer, an electron transport layer and a cathode electrode, all of the light emitting units are divided into a plurality of light emitting sets, each light emitting set includes at least two light emitting units and the light emitting units in a same light emitting set share a same electron transport layer and a same cathode electrode. In the technical solutions of the present invention, all of the light emitting units in a same light emitting set share a same electron transport layer and a same cathode electrode, thus effectively reducing the number of the cathode electrodes.

17 Claims, 7 Drawing Sheets

(51) Int. Cl.
*H01L 33/00* (2010.01)
*H01L 27/15* (2006.01)
*H01L 33/08* (2010.01)
*H01L 33/14* (2010.01)
*H01L 25/075* (2006.01)
*H01L 33/62* (2010.01)
*H01L 33/58* (2010.01)

(52) U.S. Cl.
CPC ............ *H01L 33/00* (2013.01); *H01L 33/007* (2013.01); *H01L 33/08* (2013.01); *H01L 33/14* (2013.01); *H01L 33/58* (2013.01); *H01L 33/62* (2013.01); *H01L 2933/0016* (2013.01)

(56) References Cited

FOREIGN PATENT DOCUMENTS

| | | |
|---|---|---|
| CN | 103367383 A | 10/2013 |
| CN | 105742446 A | 7/2016 |

LIGHT EMITTING ELEMENT HAVING A CONDUCTIVE PATTERN AND FABRICATION METHOD THEREOF

TECHNICAL FIELD

The present invention relates to the field of display technology, and particularly relates to a light emitting element and a fabrication method thereof.

This is a National Phase Application filed under 35 U.S.C. 371 as a national stage of PCT/CN2017/073058, filed Feb. 7, 2017, an application claiming the benefit of Chinese Application No. 201610282677.8, filed Apr. 29, 2016, the content of each of which is hereby incorporated by reference in its entirety.

BACKGROUND

FIG. 1 is a top view of a light emitting element in the prior art, and FIG. 2 is a schematic cross-sectional view taken along line A-A in FIG. 1. As shown in FIGS. 1 and 2, the light emitting element includes: a base substrate 1 and a plurality of light emitting units 2 provided on the base substrate 1; each of the light emitting units 2 includes one separate light emitting diode (LED) chip, which includes an anode electrode 4, a hole transport layer 7, a light emitting layer 6, an electron transport layer 3 and a cathode electrode 5, wherein both the cathode electrode 5 and the light emitting layer 6 are located on the electron transport layer 3 and separated from each other, the hole transport layer 7 is located on the light emitting layer 6, and the anode electrode 4 is located on the hole transport layer.

In the prior art, restricted by patterns of the anode electrode and the cathode electrode, each light emitting unit in the light emitting element has a minimum size approximately equal to a sum of a size of the anode electrode and a size of the cathode electrode, so that the size of the light emitting unit can hardly be further reduced, and resolution of the light emitting element is limited.

SUMMARY

The present invention provides a light emitting element and a fabrication method thereof, and aims to solve at least one of the technical problems in the prior art.

In order to achieve the above object, the present invention provides a light emitting element, including: a base substrate and a plurality of light emitting units provided on the base substrate, wherein, each light emitting unit includes: an anode electrode, a hole transport layer, a light emitting layer, an electron transport layer and a cathode electrode, all of the light emitting units are divided into a plurality of light emitting sets, and the light emitting units in a same light emitting set share a same electron transport layer and a same cathode electrode.

Optionally, a conductive pattern is provided correspondingly in the periphery of each light emitting unit and has a resistance smaller than a resistance between the cathode electrode and the anode electrode of the corresponding light emitting unit.

Optionally, the conductive pattern is located in an area on the electron transport layer which is not covered by the light emitting layer.

Optionally, a light blocking hood is provided correspondingly in the periphery of each light emitting unit and encircles the light emitting unit.

Optionally, the conductive pattern is in an annular shape, and the light blocking hood is on the conductive pattern.

Optionally, a material of the conductive pattern is at least one selected from the group consisting of gold, platinum and graphene.

Optionally, the light emitting units in a same light emitting set are arranged in a first direction, and the electron transport layer is in a plate-like shape and extends in the first direction.

Optionally, the cathode electrode comprises a first cathode sub-electrode pattern and a second cathode sub-electrode pattern, which are located at two ends of the electron transport layer, respectively.

Optionally, a current spreading layer is provided between the anode electrode and the hole transport layer.

Optionally, a material of the hole transport layer is P-type gallium nitride;
a material of the light emitting layer is gallium nitride; and
a material of the electron transport layer is N-type gallium nitride.

Optionally, the base substrate is a sapphire substrate or a glass substrate.

In order to achieve the above object, the present invention further provides a fabrication method of a light emitting element, including a step of:
forming a plurality of light emitting units on a base substrate, wherein each light emitting unit comprises an anode electrode, a hole transport layer, a light emitting layer, an electron transport layer and a cathode electrode, all of the light emitting units are divided into a plurality of light emitting sets, and the light emitting units in a same light emitting set share a same electron transport layer and a same cathode electrode.

Optionally, the step of forming the plurality of light emitting units includes:
sequentially forming an electron transport layer film, a light emitting layer film and a hole transport layer film on the base substrate;
performing one patterning process on the light emitting layer film and the hole transport layer film to form patterns of the hole transport layer and the light emitting layer of each light emitting unit;
performing one patterning process on the electron transport layer film to form patterns of a plurality of electron transport layers, wherein the electron transport layers are in one-to-one correspondence with the light emitting sets, and all of the light emitting units in a same light emitting set share a same electron transport layer;
forming a first conductive film on the electron transport layer, and performing one patterning process on the first conductive film to form a pattern of the cathode electrode on the electron transport layer, wherein the light emitting units in a same light emitting set share a same cathode electrode; and
forming a second conductive film on the hole transport layer, and performing one patterning process on the second conductive film to form a pattern of the anode electrode on the hole transport layer.

Optionally, the fabrication method further includes: forming a third conductive film on the electron transport layer and performing one patterning process on the third conductive film to form conductive patterns in areas on the electron transport layer which are not covered by the light emitting layer, wherein the conductive patterns are in one-to-one correspondence with the light emitting units and each located in the periphery of the corresponding light emitting unit, and resistance of the conductive pattern is smaller than resistance between the cathode electrode and the anode electrode of the corresponding light emitting unit.

Optionally, the fabrication method further includes: forming a light blocking hood encircling the light emitting unit in the periphery of the light emitting unit.

Optionally, the conductive pattern is in an annular shape, the conductive pattern and the light blocking hood are formed using a same mask, and the light blocking hood is located on the conductive pattern.

Optionally, before the step of forming the pattern of the anode electrode on the hole transport layer, the fabrication method further includes:

forming a current spreading layer film on the hole transport layer and perforating one patterning process on the current spreading layer film to form a pattern of the current spreading layer.

Optionally, all of the light emitting units in a same light emitting set are arranged in a first direction, the electron transport layer is in a plate-like shape and extends in the first direction, the cathode electrode comprises a first cathode sub-electrode pattern and a second cathode sub-electrode pattern, which are located at two ends of the corresponding electron transport layer, respectively.

Optionally, the step of forming the plurality of light emitting units comprises: sequentially forming an electron transport layer film, a light emitting layer film, a hole transport layer film, and a current spreading layer film on the base substrate; performing one patterning process on the light emitting layer film, the hole transport layer film and the current spreading layer film to form patterns of the hole transport layer, the light emitting layer and a current spreading layer of each light emitting unit; performing one patterning process on the electron transport layer film to form a pattern of the electron transport layer; forming one conductive film on the current spreading layer and the electron transport layer, and simultaneously forming the anode electrode, a conductive pattern encircling the light emitting unit, a first cathode sub-electrode pattern and a second cathode sub-electrode pattern through one patterning process.

The present invention has beneficial effects as follows.

The present invention provides a light emitting element and a fabrication method thereof. The light emitting element includes: an anode electrode, a hole transport layer, a light emitting layer, an electron transport layer and a cathode electrode, all of the light emitting units are divided into a plurality of light emitting sets, each light emitting set includes at least two light emitting units and the light emitting units in a same light emitting set share a same electron transport layer and a same cathode electrode. In the technical solutions of the present invention, all of the light emitting units in a same light emitting set share a same electron transport layer and a same cathode electrode, thus effectively reducing the number of the cathode electrodes. In this case, there is no need to provide a cathode electrode in areas corresponding to a part of the light emitting units, and the part of the light emitting units can have a minimum size approximately equal to the size of the anode electrode. Therefore, as compared with the prior art, sizes of a part of the light emitting units in the light emitting element can be effectively reduced in the technical solutions of the present invention, which allows the number of light emitting units that can be provided in the light emitting element to be increased, and further facilitates improving resolution of the light emitting element.

DETAILED DESCRIPTION

To enable those skilled in the art to better understand technical solutions of the present invention, a light emitting element and a fabrication method thereof provided in the present invention will be described in detail below in conjunction with the accompanying drawings.

First Embodiment

Figure 1:
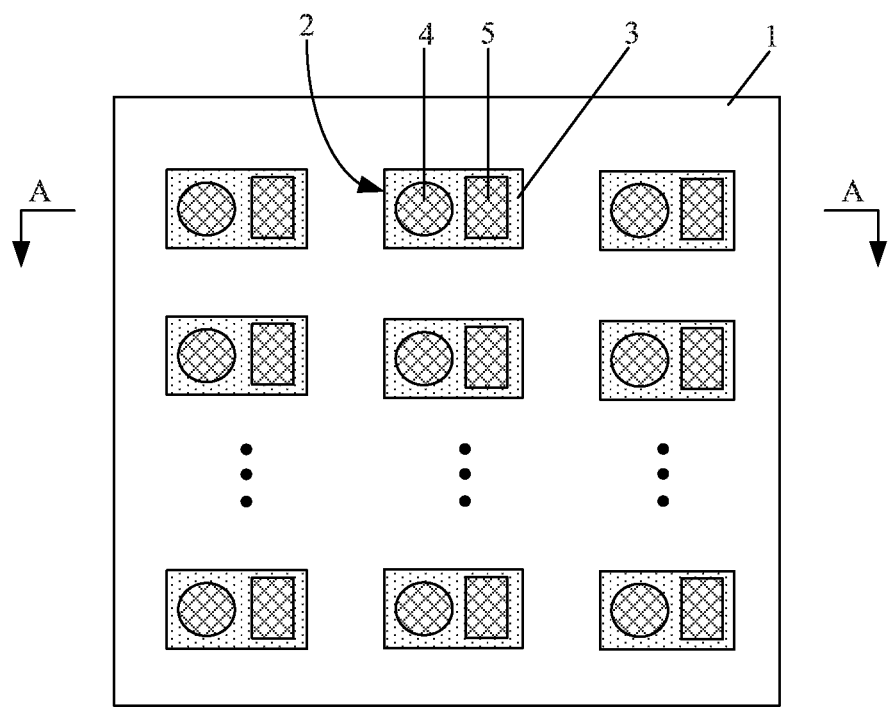
FIG. 1 is a top view of a light emitting element in the prior art.
Figure 2:
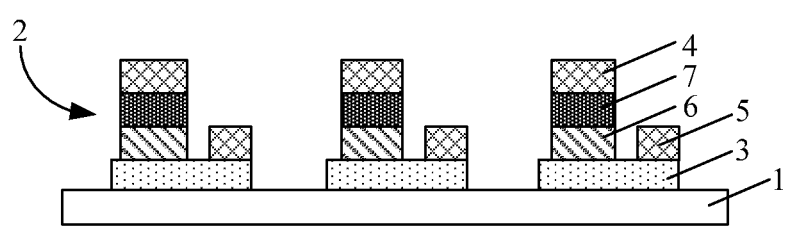
FIG. 2 is a schematic cross-sectional view taken along line A-A of the light emitting element in FIG. 1.
Figure 3:
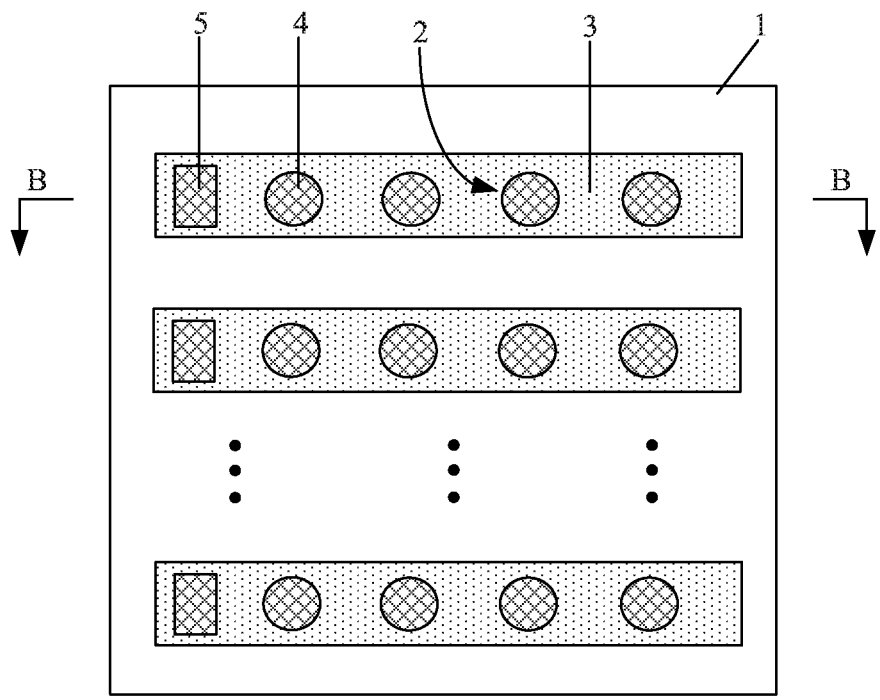
FIG. 3 is a top view of a light emitting element provided in a first embodiment of the present invention.
Figure 4:
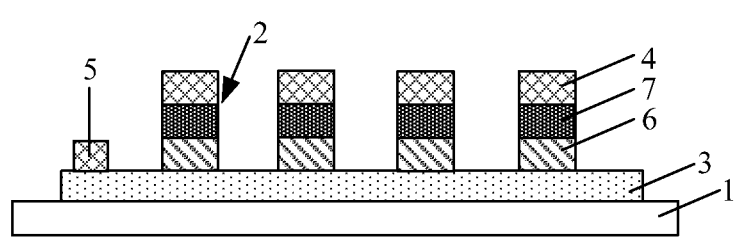
FIG. 4 is a schematic cross-sectional view taken alone line B-B of one light emitting set in FIG. 3.

FIG. 3 is a top view of a light emitting element provided in the first embodiment of the present invention, and FIG. 4 is a schematic cross-sectional view taken alone line B-B of one light emitting set in FIG. 3. As shown in FIGS. 3 and 4, the light emitting element includes: a base substrate 1 and a plurality of light emitting units 2 provided on the base substrate 1, the light emitting unit 2 includes: an anode electrode 4, a hole transport layer 7, a light emitting layer 6, an electron transport layer 3 and a cathode electrode 5, all of the light emitting units 2 are divided into a plurality of light emitting sets, each light emitting set includes at least two light emitting units 2, and all of the light emitting units 2 in a same light emitting set share a same electron transport layer 3 and a same cathode electrode 5.

In the present embodiment, optionally, the base substrate 1 is a sapphire substrate or a glass substrate, and the light emitting unit 2 is a gallium nitride light emitting diode. Specifically, the material of the hole transport layer 7 is P-type gallium nitride, the material of the light emitting layer 6 is gallium nitride, and the material of the electron transport layer 3 is N-type gallium nitride.

It should be noted that, the materials of the above-mentioned structures are merely exemplary, and are not intended to limit the technical solutions of the present invention.

In the prior art, because each light emitting unit includes a separate cathode electrode, the minimum size of the light emitting unit is approximately equal to the sum of a size of the anode electrode and a size of the cathode electrode. In the present invention, all of the light emitting units 2 in a same light emitting set share a same electron transport layer 3 and a same cathode electrode 5, that is, multiple light emitting units 2 correspond to one cathode electrode 5, thus effectively reducing the number of the cathode electrodes 5. In this case, there is no need to provide a cathode electrode 5 in areas corresponding to a part of the light emitting units 2, and the part of the light emitting units 2 may have a minimum size approximately equal to the size of the anode electrode 4 accordingly. Therefore, as compared with the prior art, sizes of a part of the light emitting units 2 in the light emitting element can be effectively reduced in the technical solutions of the present invention, which allows the number of light emitting units 2 that can be provided in the light emitting element to be increased, and further facilitates improving resolution of the light emitting element.

Second Embodiment

It is found in practical applications that as a distance between the anode electrode 4 and the cathode electrode 5 of the light emitting unit 2 increases, a conductive resistance of the light emitting unit 2 gradually increases, so that current flowing through different light emitting units 2 has different sizes, finally resulting in non-uniformity in the light-emitting characteristics of the light-emitting units 2.

Figure 5:
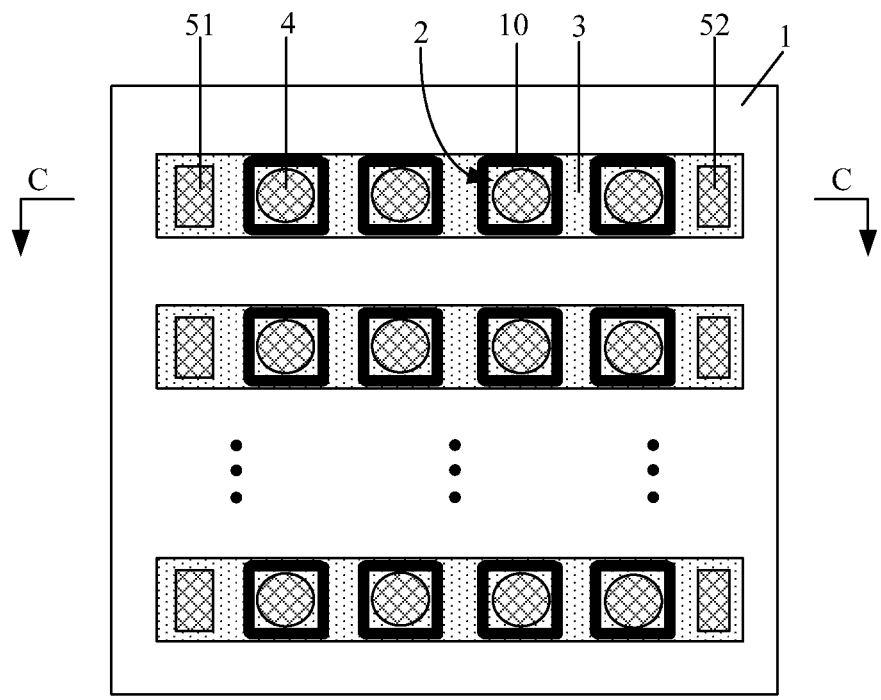
FIG. 5 is a top view of a light emitting element provided in a second embodiment of the present invention.
Figure 6:
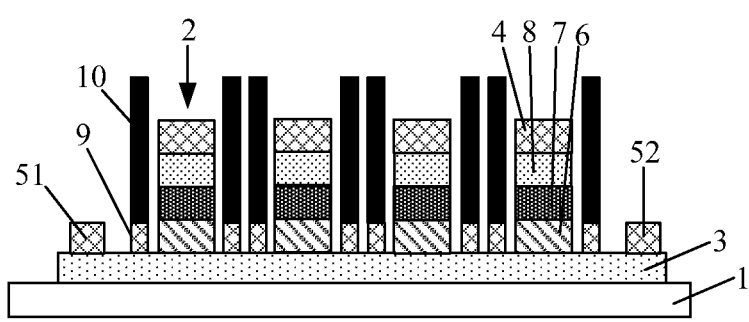
FIG. 6 is a schematic cross-sectional view taken alone line C-C of one light emitting set in FIG. 5.

In order to solve the above technical problem, the second embodiment of the present invention provides a light emitting element. FIG. 5 is a top view of a light emitting element provided in the second embodiment of the present invention, and FIG. 6 is a schematic cross-sectional view taken alone line C-C of one light emitting set in FIG. 5. As shown in FIGS. 5 and 6, the light emitting element provided in the present embodiment is an improvement on the basis of the light emitting element in the first embodiment described above, and includes, in addition to the structures in the light emitting element in the first embodiment, a conductive pattern 9 provided correspondingly in the periphery of each light emitting unit 2 and having a resistance smaller than the resistance between the cathode electrode 5 and the anode electrode 4 of the corresponding light emitting unit 2. Optionally, the conductive pattern 9 is located in an area on the electron transport layer 3 which is not covered by the light emitting layer 6.

In the present embodiment, one conductive pattern 9 having a smaller resistance is provided in the periphery of each light emitting unit 2 and is connected in parallel with a resistor between the cathode electrode 5 and the anode electrode 4 of the light emitting unit 2, such that the equivalent resistance between the cathode electrode 5 and the anode electrode 4 of each light emitting unit 2 is smaller than the resistance of the conductive pattern 9. In the case that the conductive pattern 9 has a relatively small resistance value, the equivalent resistance between the cathode electrode 5 and the anode electrode 4 of each light emitting unit 2 in the light emitting element can be restricted to a relatively small range, and in this case, the equivalent resistance between the cathode electrode 5 and the anode electrode 4 of each light emitting unit 2 is approximately identical. Accordingly, the sizes of current flowing through the light emitting units 2 are also the same, and the light emitting characteristics of the light emitting units 2 tend to be uniform.

In the present embodiment, the material of the conductive pattern 9 may be a low resistivity material. Specifically, the material of the conductive pattern 9 is at least one selected from the group consisting of gold, platinum and graphene.

In addition, in the present embodiment, conductive patterns 9 are provided correspondingly in the periphery of the light emitting units 2, so that the equivalent resistance between the cathode electrode 5 and the anode electrode 4 of each light emitting unit 2 is reduced, accordingly, driving current required by each light emitting unit 2 is also decreased, and an overall power consumption of the light emitting element is lowered.

In the present embodiment, in order to avoid optical crosstalk between adjacent light emitting units 2, optionally, a light blocking hood 10 is provided correspondingly in the periphery of each light emitting unit 2 and surrounds the light emitting unit 2. The light blocking hood 10 surrounds the corresponding light emitting unit 2, so that light generated by the corresponding light emitting unit 2 is prevented from being emitted to other light emitting unit 2, and light generated by the other light emitting unit 2 is prevented from being emitted to the corresponding light emitting unit 2, thereby effectively avoiding optical crosstalk.

Further optionally, the shape of the conductive pattern 9 is annular, the light blocking hood 10 is located on the conductive pattern 9, and in this case the orthographic projection of the light blocking hood 10 on the base substrate 1 completely coincides with that of the conductive pattern 9 on the base substrate 1. Thus, a same mask may be used in both the patterning process for the light blocking hood 10 and the patterning process for the conductive pattern 9.

It should be understood by a person skilled in the art that, the shape of the light blocking hood 10 in the present embodiment may be any annular shape such as a circular ring shape, a rectangular ring shape, or the like, and FIG. 5 shows a case where the light blocking hood 10 is in the shape of rectangular ring for illustrative purpose only, which does not limit the technical solutions of the present invention.

As another improved solution in the present embodiment, continuing to refer to FIGS. 5 and 6, optionally, all of the light emitting units 2 in a same light emitting set are arranged in a first direction (corresponding to the row direction in the figures), and the electron transport layer 3 is in a plate-like shape and extends in the first direction. The cathode electrode 5 includes a first cathode sub-electrode pattern 51 and a second cathode sub-electrode pattern 52, which are located at two ends of the corresponding electron transport layer 3, respectively. In this case, the sum of distances of each of the light emitting units 2 in a same light emitting set from the first cathode sub-electrode pattern 51 and from the second cathode sub-electrode pattern 52 is the same. Accordingly, the resistance between the anode electrode 4 and the cathode electrode 5 (equal to the sum of the resistance between the anode electrode 4 and the first cathode sub-electrode pattern 51 and the resistance between the anode electrode 4 and the second cathode sub-electrode pattern 52) in each of the light emitting units 2 in a same light emitting set is the same. Thus, after the first cathode sub-electrode pattern 51 and the second cathode sub-electrode pattern 52 are connected to a power supply, the current flowing through each light emitting unit 2 also has a same size, and the light emitting characteristics of the light emitting units 2 tend to be uniform.

In the present embodiment, by providing the first cathode sub-electrode pattern 51 and the second cathode sub-electrode pattern. 52 at two ends of the electron transport layer 3, respectively, uniformity of current flowing through the light emitting units 2 in a same light emitting set can be effectively enhanced.

It should be noted that, in practical applications, the design of two cathode sub-electrode patterns is separately adopted, or the design of the conductive pattern 9 is separately adopted, or the design of both two cathode sub-electrode patterns and the conductive pattern 9 is adopted according to actual needs depending on factors such as the size of the light emitting element, specific performance requirements and cost considerations.

In the present embodiment, optionally, as shown in FIG. 6, a current spreading layer 8 is provided between the anode electrode 4 and the hole transport layer 7 and allows the current to spread into an area that is not covered by the anode electrode 4, thus increasing light escape efficiency. Optionally, the material of the current spreading layer 8 is at least one selected from the group consisting of nickel and gold.

Third Embodiment

The third embodiment of the present invention provides a fabrication method of a light emitting element, which is used for fabricating the light emitting element described in the first or second embodiment. The fabrication method of a light emitting element includes:

step A of forming a plurality of light emitting units on a base substrate, wherein each light emitting unit includes an anode electrode, a hole transport layer, a light emitting layer, an electron transport layer and a cathode electrode, all of the light emitting units are divided into a plurality of light emitting sets, and all of the light emitting units in a same light emitting set share a same electron transport layer and a same cathode electrode.

In the present embodiment, all of the light emitting units in a same light emitting set share a same electron transport layer and a same cathode electrode, and thus the number of the cathode electrodes can be effectively reduced. In this case, there is no need to provide a cathode electrode in areas corresponding to a part of the light emitting units, and the part of the light emitting units can have a minimum size approximately equal to the size of the anode electrode. Therefore, as compared with the prior art, sizes of a part of the light emitting units in the light emitting element can be effectively reduced in the technical solutions of the present invention, which allows the number of light emitting units that can be provided in the light emitting element to be increased, and further facilitates improving resolution of the light emitting element.

Fourth Embodiment

Figure 7:
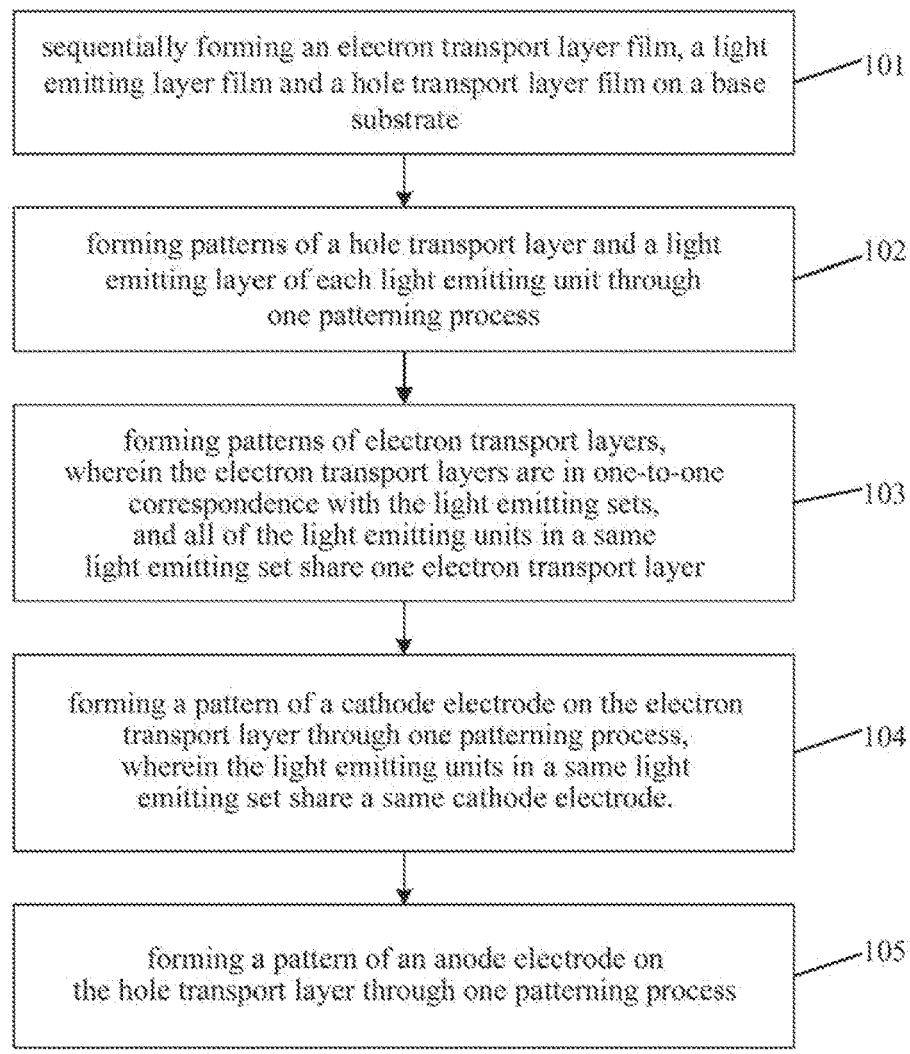
FIG. 7 is a flow chart of a fabrication method of a light emitting element provided in a fourth embodiment of the present invention.

FIG. 7 is a flow chart of a fabrication method of a light emitting element provided in the fourth embodiment of the present invention, and as shown in FIG. 7, the fabrication method is used for fabricating the light emitting element described in the first embodiment, and includes the following steps 101 to 105.

Step 101 includes sequentially forming an electron transport layer film, a light emitting layer film and a hole transport layer film on a base substrate.

Figure 8A:
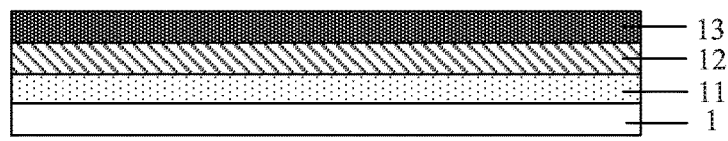
FIG. 8a is a schematic structure diagram of forming an electron transport layer film, a light emitting layer film and a hole transport layer film in the present invention.

FIG. 8a is a schematic diagram of a structure when forming an electron transport layer film, a light emitting layer film and a hole transport layer film in the present invention, and as shown in FIG. 8a, the electron transport layer film 11, the light emitting layer film 12 and the hole transport layer film 13 are sequentially formed can the base substrate 1 by metal-organic chemical vapor deposition (MOCVD) process, plasma enhanced chemical vapor deposition (PECVD) process or sputtering process.

Optionally, the base substrate 1 is a sapphire substrate or a glass substrate, the material of the hole transport layer film 13 is P-type gallium nitride, the material of the light emitting layer film 12 is gallium nitride, and the material of the electron transport layer film 11 is N-type gallium nitride.

Step 102 includes performing one patterning process on the light emitting layer film and the hole transport layer film to form patterns of a hole transport layer and a light emitting layer of each light emitting unit.

Figure 8B:
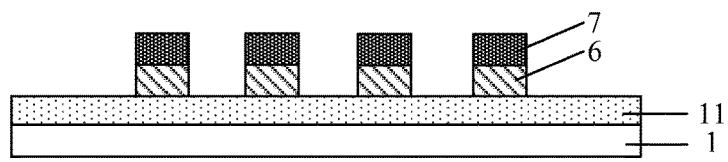
FIG. 8b is a schematic structure diagram of forming a hole transport layer and a light emitting layer in the present invention.

FIG. 8b is a schematic diagram of a structure when forming patterns of a hole transport layer and a light emitting layer in the present invention, and as shown in FIG. 8b, one patterning process is performed on the light emitting layer film 12 and the hole transport layer film 13 to simultaneously form patterns of the hole transport layers 7 and the light emitting layers 6, and at this point, the electrode transport layer film 11 is not patterned. When etching the light emitting layer film 12 and the hole transport layer film 13 to respectively form patterns of the hole transport layers 7 and the light emitting layers 6, inductively couple plasma (ICP) etching process may be adopted.

It should be noted that the patterning process in the present invention is intended to include process steps of photoresist coating, exposure, development, etching, photoresist peeling, and the like.

Step 103 includes performing one patterning process on the electron transport layer film to form patterns of a plurality of electron transport layers, wherein the electron transport layers are in one-to-one correspondence with the light emitting sets, and all of the light emitting units in a same light emitting set share one electron transport layer.

Figure 8C:
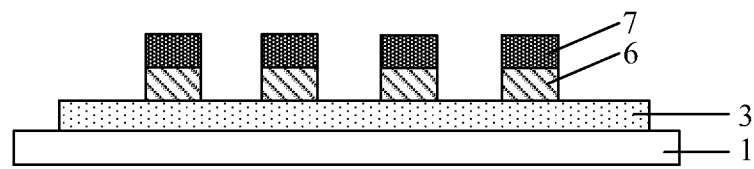
FIG. 8c is a schematic structure diagram of forming an electron transport layer n the present invention.

FIG. 8c is a schematic diagram of a structure when forming a pattern of an electron transport layer in the present invention. As shown in FIG. 8c, according to a preset light emitting set division plan, a patterning process is performed on the electron transport layer film to form patterns of a plurality of electron transport layers 3 whose number is equal to the number of the light emitting sets, wherein, each light emitting set corresponds to one electron transport layer 3, and all of the light emitting units 2 in a same light emitting set share one electron transport layer 3. When etching the electron transport layer film 11 to form the patterns of the electron transport layers 3, ICP etching process may be adopted.

Step 104 includes forming a first conductive film on the electron transport layer, and performing one patterning process on the first conductive film to form a pattern of a cathode electrode on the electron transport layer, wherein the light emitting units in a same light emitting set share a same cathode electrode.

Referring to FIG. 4, in step 104, the cathode electrodes 5 are formed on the electron transport layers 3 by one patterning process, the pattern of only one cathode electrode 5 is formed on the pattern of each electron transport layer 3, and in this case, all of the light emitting units 2 in a same light emitting set share a same cathode electrode 5.

In the present embodiment, the material of the cathode electrode 5 may be at least one selected from the group consisting of titanium and gold.

Step 105 includes forming a second conductive film on the hole transport layer, and performing one patterning process on the second conductive film to form a pattern of an anode electrode on the hole transport layer.

Referring to FIG. 4, in step 105, the anode electrodes 4 are formed on the hole transport layers 7 through one patterning process. In the present embodiment, materials of the anode electrodes 4 and the cathode electrodes 5 may be at least one selected from the group consisting of titanium and gold.

It should be noted that, in the present embodiment, step 105 may be performed prior to step 104.

In addition, in the present embodiment, when the material of the anode electrodes 4 is the same as that of the cathode electrodes 5, one conductive film layer may be formed on both the electron transport layers 3 and the hole transport layers 7 simultaneously, and patterns including the anode electrodes 4 and the cathode electrodes 5 are simultaneously formed through one patterning process.

Fifth Embodiment

Figure 9:
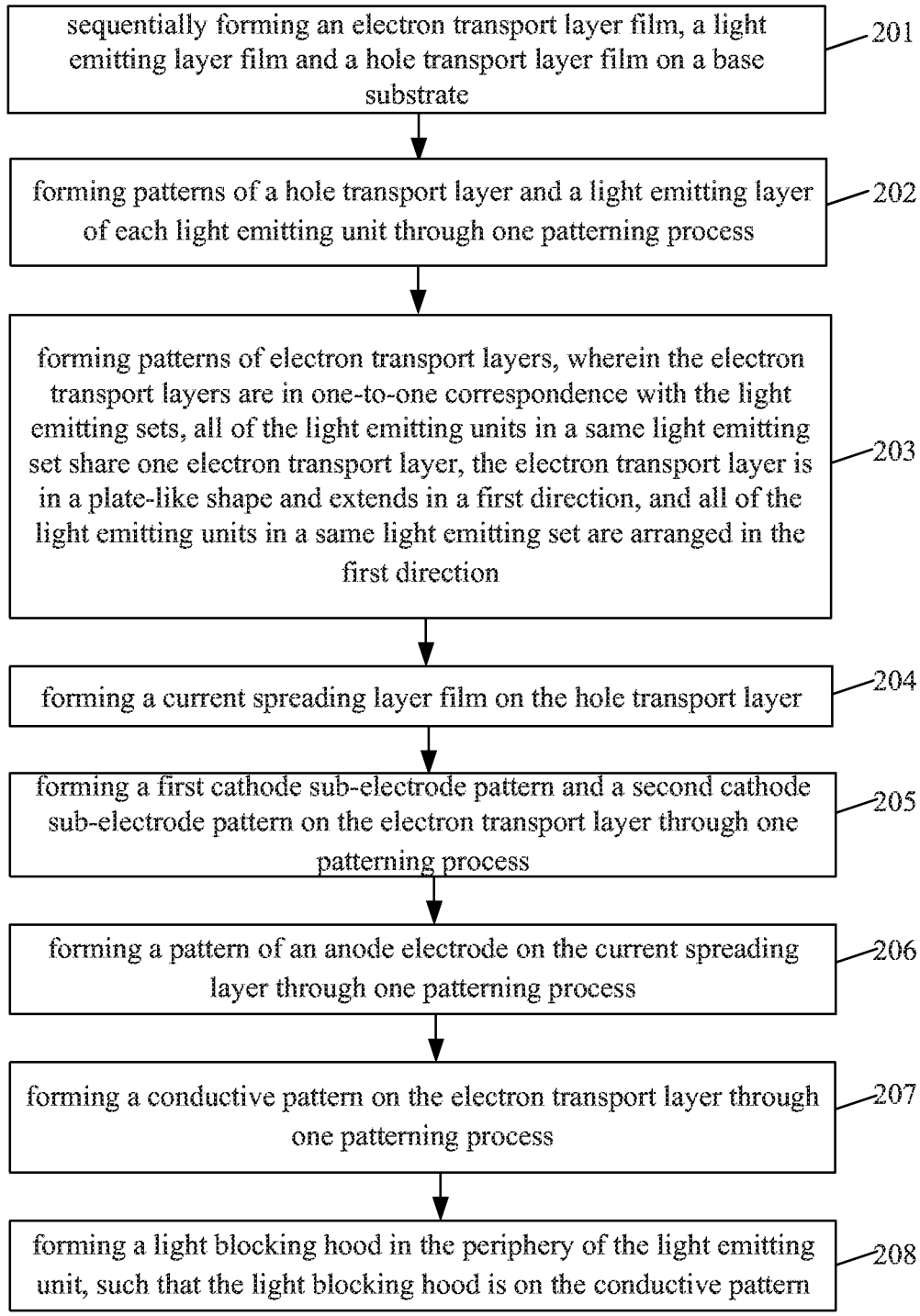
FIG. 9 is a flow chart of a fabrication method of a light emitting element provided in a fifth embodiment of the present invention.

FIG. 9 is a flow chart of a fabrication method of a light emitting element provided in the fifth embodiment of the present invention, and as shown in FIG. 9, the fabrication method is used for fabricating the light emitting element described in the second embodiment, and includes the following steps 201 to 208.

Step 201 includes sequentially forming an electron transport layer film, a light emitting layer film and a hole transport layer film on a base substrate.

Step 202 includes performing one patterning process on the light emitting layer film and the hole transport layer film to form patterns of a hole transport layer and a light emitting layer of each light emitting unit.

Step 203 includes performing one patterning process on the electron transport layer film to form patterns of a plurality of electron transport layers, wherein the electron transport layers are in one-to-one correspondence with the light emitting sets, all of the light emitting units in a same light emitting set share a same electron transport layer, the electron transport layer is in a plate-like shape and extends in a first direction, and all of the light emitting units in a same light emitting set are arranged in the first direction.

It should be noted that processes of steps 201 to 203 in the present embodiment are the same as those of steps 101 to 103 described in the fourth embodiment, and specific contents thereof may refer to corresponding description in the fourth embodiment, which are not repeated here.

Step 204 includes forming a current spreading layer film on the hole transport layer and performing one patterning process on the current spreading layer film to form a pattern of a current spreading layer.

Figure 10A:
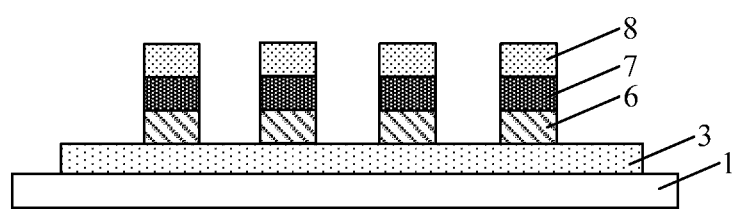
FIG. 10a is a schematic structure diagram of forming a current spreading layer in the present invention.

FIG. 10a is a schematic diagram of a structure when forming a current spreading layer in the present invention, and as shown in FIG. 10a, one patterning process is performed on the current spreading layer film, which is a conductive film, to form patterns of the current spreading layers 8, wherein the current spreading layers 8 are on the hole transport layers 7. Optionally, the material of the current spreading layers 8 is at least one selected from the group consisting of nickel and gold.

Step 205 includes forming a first conductive film on the electron transport layer and performing one patterning process on the first conductive film to form a first cathode sub-electrode pattern and a second cathode sub-electrode pattern, wherein the light emitting units in a same light emitting set share a same first cathode sub-electrode pattern and a same second cathode sub-electrode pattern, and the first cathode sub-electrode pattern and the second cathode sub-electrode pattern are located at two ends of the electron transport layer, respectively.

Step 206 includes forming a second conductive film on the current spreading layer and performing one patterning process on the second conductive film to form a pattern of an anode electrode on the current spreading layer.

Step 207 includes forming a third conductive film on the electron transport layer and performing one patterning process on the third conductive film to form conductive patterns in areas on the electron transport layer which are not covered by the light emitting layer, wherein the conductive patterns are in one-to-one correspondence with the light emitting units and each located in the periphery of the corresponding light emitting unit, and resistance of the conductive pattern is smaller than the resistance between the cathode electrode and the anode electrode of the corresponding light emitting unit.

Figure 10B:
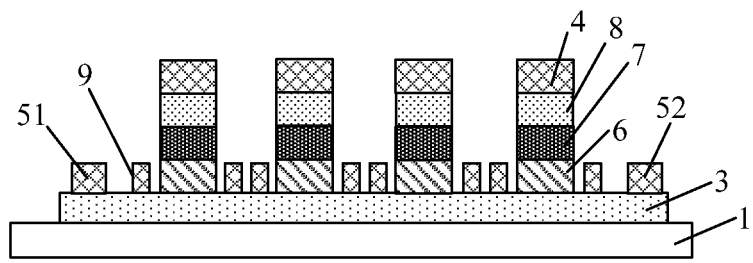
FIG. 10b is a schematic structure diagram of forming an anode electrode, a cathode electrode and a conductive pattern in the present invention.

FIG. 10b is a schematic diagram of a structure when forming an anode electrode, a cathode electrode and a conductive pattern in the present invention. As shown in FIG. 10b, in the present embodiment, by forming the first cathode sub-electrode pattern 51 and the second cathode sub-electrode pattern 52 at two ends of the electron transport layer 3 in step 205, respectively, uniformity of current flowing through the light emitting units 2 in a same light emitting set can be effectively improved. By forming the conductive pattern 9 in the periphery of each light emitting unit 2 in step 207, driving current can be effectively reduced while uniformity of current flowing through the light emitting units 2 in the light emitting element is improved. Specific principle may refer to the description in the second embodiment, and is not repeated here.

In the present embodiment, optionally, the conductive pattern 9 is in an annular shape to encircle the corresponding light emitting unit 2.

It should be noted that, in the present embodiment, the order in which steps 205, 206, and 207 are performed is not limited, that is, step 206 may be performed prior to step 205, and step 207 may be performed prior to steps 205 and 206.

In addition, in the present embodiment, when materials of the anode electrodes 4, the first cathode sub-electrode patterns 51, the second cathode sub-electrode patterns 52 and the conductive patterns 9 are the same, as an alternative of steps 205 to 207, one conductive film layer may be formed on the electron transport layer 3 and the current spreading layer 8, and patterns including the anode electrodes 4, the first cathode sub-electrode patterns 51, the second cathode sub-electrode patterns 52 and the conductive patterns 9 are simultaneously formed through one patterning process.

Step 208 includes forming a light blocking hood surrounding the light emitting unit in the periphery of the light emitting unit, wherein the light blocking hood is on the conductive pattern.

Referring to FIGS. 5 and 6, in the present embodiment, it is preferable to design the cross-sectional shape of the light blocking hood 10 to be identical to the cross-sectional shape of the conductive pattern 9, and in this case, the mask used in step 207 may be adopted to form the light blocking hood 10, which can effectively reduce the number of masks used in the production process and further lower production cost.

Optionally, steps 201 to 204 may be replaced with the following steps:
  first, sequentially forming an electron transport layer film, a light emitting layer film, a hole transport layer film and a current spreading layer film on a base substrate;
  then, performing one patterning process on the light emitting layer film, the hole transport layer film and the current spreading layer film to form patterns of a hole transport layer, a light emitting layer and a current spreading layer of each light emitting unit, as shown in FIG. 10b; and subsequently, performing one patterning process on the electron transport layer film to form a pattern of the electron transport layer.

It can be understood that, the above implementations are merely exemplary implementations used for explaining the principle of the present invention, but the present invention is not limited thereto. For those skilled in the art, various modifications and improvements may be made without departing from the spirit and essence of the present invention, and these modifications and improvements are also deemed as falling within the protection scope of the present invention.

The invention claimed is:

1. A light emitting element, comprising:
   a base substrate, and
   a plurality of light emitting units provided on the base substrate,
   wherein each light emitting unit comprises:
   an anode electrode,
   a hole transport layer,
   a light emitting layer,
   an electron transport layer, and
   a cathode electrode, all of the light emitting units are divided into a plurality of light emitting sets, and the light emitting units in a same light emitting set share a same electron transport layer and share a cathode electrode,
   wherein a conductive pattern is provided correspondingly in the periphery of each light emitting unit and has a resistance smaller than a resistance between the cathode electrode and the anode electrode of the corresponding light emitting unit.

2. The light emitting element according to claim 1, wherein the conductive pattern is located in an area on the electron transport layer which is not covered by the light emitting layer.

3. The light emitting element according to claim 1, wherein a light blocking hood is provided correspondingly in the periphery of each light emitting unit and encircles the light emitting unit.

4. The light emitting element according to claim 3, wherein the conductive pattern is in an annular shape, and the light blocking hood is on the conductive pattern.

5. The light emitting element according to claim 1, wherein a material of the conductive pattern is at least one selected from the group consisting of gold, platinum and graphene.

6. The light emitting element according to claim 1, wherein the light emitting units in a same light emitting set are arranged in a first direction, and the electron transport layer is in a plate-like shape and extends in the first direction.

7. The light emitting element according to claim 6, wherein the cathode electrode comprises a first cathode sub-electrode pattern and a second cathode sub-electrode pattern, which are located at two ends of the electron transport layer, respectively.

8. The light emitting element according to claim 1, wherein a current spreading layer is provided between the anode electrode and the hole transport layer.

9. The light emitting element according to claim 1, wherein a material of the hole transport layer is P-type gallium nitride;
   a material of the light emitting layer is gallium nitride; and
   a material of the electron transport layer is N-type gallium nitride.

10. The light emitting element according to claim 1, wherein the base substrate is a sapphire substrate or a glass substrate.

11. A fabrication method of a light emitting element, comprising a step of:
    forming a plurality of light emitting units on a base substrate, wherein each light emitting unit comprises an anode electrode, a hole transport layer, a light emitting layer, an electron transport layer and a cathode electrode, all of the light emitting units are divided into a plurality of light emitting sets, and the light emitting units in a same light emitting set share a same electron transport layer and share a cathode electrode,
    wherein the step of forming the plurality of light emitting units comprises:
    sequentially forming an electron transport layer film, a light emitting layer film and a hole transport layer film on the base substrate;
    performing one patterning process on the light emitting layer film and the hole transport layer film to form patterns of the hole transport layer and the light emitting layer of each light emitting unit,
    performing one patterning process on the electron transport layer film to form patterns of a plurality of electron transport layers, wherein the electron transport layers are in one-to-one correspondence with the light emitting sets, and all of the light emitting units in a same light emitting set share a same electron transport layer;
    forming a first conductive film on the electron transport layer, and performing one patterning process on the first conductive film to form a pattern of the cathode electrode on the electrode transport layer, wherein the light emitting units in a same light emitting set share a cathode electrode; and
    forming a second conductive film on the hole transport layer, and performing one patterning process on the second conductive film to form a pattern of the anode electrode on the hole transport layer,
    the method further comprising: forming a third conductive film on the electron transport layer and performing one patterning process on the third conductive film to form conductive patterns in areas on the electron transport layer which are not covered by the light emitting layer, wherein the conductive patterns are in one-to-one correspondence with the light emitting units and each located in the periphery of the corresponding light emitting unit, and resistance of the conductive pattern is smaller than resistance between the cathode electrode and the anode electrode of the corresponding light emitting unit.

12. The fabrication method of a light emitting element according to claim 11, further comprising: forming a light blocking hood encircling the light emitting unit in the periphery of the light emitting unit.

13. The fabrication method of a light emitting element according to claim 12, wherein the conductive pattern is in an annular shape, the conductive pattern and the light blocking hood are formed using a same mask, and the light blocking hood is located on the conductive pattern.

14. The fabrication method of a light emitting element according to claim 11, further comprising, before the step of forming the pattern of the anode electrode on the hole transport layer,
    forming a current spreading layer film on the hole transport layer and performing one patterning process on the current spreading layer film to form a pattern of the current spreading layer.

15. The fabrication method of a light emitting element according to claim 11, wherein the step of forming a plurality of light emitting units on a base substrate comprises forming the plurality of light emitting units such that all of the light emitting units in a same light emitting set are arranged in a first direction, the electron transport layer is in a plate-like shape and extends in the first direction, the cathode electrode comprises a first cathode sub-electrode pattern and a second cathode sub-electrode pattern, which are located at two ends of the corresponding electron transport layer, respectively.

16. The fabrication method of a light emitting element according to claim 11, wherein the step of forming the plurality of light emitting units comprises:

sequentially forming an electron transport layer film, a light emitting layer film, a hole transport layer film, and a current spreading layer film on the base substrate;

performing one patterning process on the light emitting layer film, the hole transport layer film and the current spreading layer film to form patterns of the hole transport layer, the light emitting layer and a current spreading layer of each light emitting unit;

performing one patterning process on the electron transport layer film to form a pattern of the electron transport layer; and forming one conductive film on the current spreading layer and the electron transport layer, and simultaneously forming the anode electrode, a conductive pattern encircling the light emitting unit, a first cathode sub-electrode pattern and a second cathode sub-electrode pattern through one patterning process.

17. The fabrication method of a light emitting element according to claim 16, further comprising: forming a light blocking hood encircling the light emitting unit in the periphery of the light emitting unit, wherein the light blocking hood is on the conductive pattern.

\* \* \* \* \*